(12) United States Patent
Wan et al.

(10) Patent No.: US 11,293,090 B2
(45) Date of Patent: Apr. 5, 2022

(54) METHOD FOR VAPOR DEPOSITING A SUBSTRATE

(71) Applicants: Beijing BOE Display Technology Co., Ltd., Beijing (CN); BOE TECHNOLOGY GROUP CO., LTD., Beijing (CN)

(72) Inventors: Jiyu Wan, Beijing (CN); Dong Wang, Beijing (CN); Yongzhi Song, Beijing (CN); Jingjing Jiang, Beijing (CN); Pengyu Qi, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 301 days.

(21) Appl. No.: 16/338,133

(22) PCT Filed: Sep. 6, 2018

(86) PCT No.: PCT/CN2018/104292
§ 371 (c)(1),
(2) Date: Mar. 29, 2019

(87) PCT Pub. No.: WO2019/114335
PCT Pub. Date: Jun. 20, 2019

(65) Prior Publication Data
US 2021/0156022 A1    May 27, 2021

(30) Foreign Application Priority Data
Dec. 14, 2017   (CN) .......................... 201711338456.9

(51) Int. Cl.
*C23C 14/28*   (2006.01)
*C23C 14/35*   (2006.01)
(Continued)

(52) U.S. Cl.
CPC ............ *C23C 14/28* (2013.01); *C03C 25/226* (2013.01); *C03C 2218/154* (2013.01);
(Continued)

(58) Field of Classification Search
USPC ..................................... 427/248.1; 204/192.1
See application file for complete search history.

(56) References Cited

U.S. PATENT DOCUMENTS 5,429,732 A * 7/1995 Dave ....................... C23C 14/46
                                                              204/192.11
2011/0311737 A1 * 12/2011 Shigeta ................... C23C 14/14
                                                              427/585

(Continued)

FOREIGN PATENT DOCUMENTS

CN         1955333 A        5/2007
CN       100540727 C        9/2009

(Continued)

OTHER PUBLICATIONS

International Search Report and Written Opinion dated Nov. 22, 2018, from application No. PCT/CN2018/104292.

*Primary Examiner* — Brian K Talbot
(74) *Attorney, Agent, or Firm* — Arch & Lake LLP

(57) ABSTRACT

The present disclosure relates to the field of vapor deposition technologies, and discloses a vapor deposition method. The vapor deposition method includes: applying an exciting acoustic wave to the target, such that particles in a predetermined location of the target break away from the target and adhere to a predetermined region of the substrate when an energy of the particles is higher than an energy required for the particles to break away from the target. By using the vapor deposition method, losses of vapor deposition materials may be avoided, utilization of the vapor deposition materials may be increased, and thus costs may be reduced.

4 Claims, 3 Drawing Sheets

Heating the target, such that an energy of the target is lower than the energy required for the particles to break away from the target — S10

Applying an exciting acoustic wave to the target, such that particles in a predetermined location of the target break away from the target and adhere to a predetermined region of the substrate when an energy of the particles is higher than an energy required for the particles to break away from the target — S20

(51) Int. Cl.
*C23C 14/34* (2006.01)
*C03C 25/226* (2018.01)

(52) U.S. Cl.
CPC ...... *C23C 14/3421* (2013.01); *C23C 14/3485* (2013.01); *C23C 14/357* (2013.01)

(56) References Cited

U.S. PATENT DOCUMENTS

| | | | |
|---|---|---|---|
| 2013/0037838 A1* | 2/2013 | Speier | H01L 51/0013 257/98 |
| 2013/0112556 A1* | 5/2013 | Nagata | C22C 27/02 204/298.13 |
| 2018/0044785 A1 | 2/2018 | Qian et al. | |

FOREIGN PATENT DOCUMENTS

| | | | |
|---|---|---|---|
| CN | 104178721 A | 12/2014 |
| CN | 105483619 A | 4/2016 |
| CN | 104178721 B | 8/2016 |
| CN | 107012433 A | 8/2017 |
| KR | 20120105837 A | 9/2012 |
| KR | 101204855 B1 | 11/2012 |

\* cited by examiner

METHOD FOR VAPOR DEPOSITING A SUBSTRATE

CROSS REFERENCE

The present application based on International Application No. PCT/CN2018/104292, filed on Sep. 6, 2018, which is based upon and claims priority to Chinese Patent Application No. 201711338456.9, filed on Dec. 14, 2017, the entire contents of which are incorporated herein by reference.

TECHNICAL FIELD

The present disclosure generally relates to the field of vapor deposition technologies, and more particularly, to a vapor deposition method and a vapor deposition apparatus.

BACKGROUND

With the rapid development of display technologies, an organic light emitting diode (OLED) has become a new favorite of modern display technologies. In the process of fabricating an OLED, an organic material for fabricating the OLED is vapor-deposited onto an OLED substrate using a crucible. The OLED substrate is covered with a mask, and the organic material is vapor-deposited onto the OLED substrate to form a predesigned pattern. Both the crucible and the OLED substrate are placed in a vacuum vapor deposition chamber, and the OLED substrate is fixed above the crucible by a vapor deposition carrier plate.

The existing vapor deposition processes adopt a direct heating manner. Organic material particles can break away from a target by heating. The organic material particles are randomly emitted from the surface of the target, and may adhere to an inside wall of the crucible and the mask where the temperature is lower. According to statistics, only about 10% of the organic material particles can reach the location required for vapor deposition of a substrate. That is, about 90% of the organic material is lost, such that the utilization of the organic material is lower, resulting in higher costs of the organic material. Furthermore, the inside wall of the crucible and the mask also need to be cleaned periodically. Neither the crucible nor the mask can be used during the cleaning process, which not only has a negative effect on the production efficiency, but also wastes manpower and material resources, and also causes environmental pollution. Moreover, corresponding masks need to be produced and provided for each product.

Therefore, a new vapor deposition method and a new vapor deposition apparatus may be desirable.

SUMMARY

An objective of the present disclosure is to provide a vapor deposition method and a vapor deposition apparatus.

According to an aspect of the present disclosure, there is provided a vapor deposition method. The method includes applying an exciting acoustic wave to a target, such that particles in a predetermined location of the target break away from the target and adhere to a predetermined region of the substrate when an energy of the particles is higher than an energy required for the particles to break away from the target.

In an exemplary arrangement of the present disclosure, the exciting acoustic wave is a rectangular standing wave.

In an exemplary arrangement of the present disclosure, the rectangular standing wave is synthesized by a plurality of sine waves or a plurality of cosine waves.

In an exemplary arrangement of the present disclosure, synthesizing the rectangular standing wave includes partitioning the target into a plurality of periodic units according to a vapor deposition requirement of the substrate. A function of the rectangular standing wave being expressed as:

$$f(x) = \frac{a_0}{2} + \sum_{1}^{\infty} a_n \cos\left(\frac{n\pi x}{L}\right).$$

$a_0$ represents an amplitude of the rectangular standing wave, $a_n$ represents an amplitude of the sine wave or an amplitude of the cosine wave, n represents a number of the sine waves or the number of the cosine waves, and L represents a width of the periodic unit.

In an exemplary arrangement of the present disclosure, a wavelength value of the sine wave and a wavelength value of the cosine wave are within a wavelength value range of an ultrasonic wave.

In an exemplary arrangement of the present disclosure, before applying an exciting acoustic wave to the target, the vapor deposition method further includes heating the target, such that an energy of the target is lower than the energy required for the particles to break away from the target.

According to another aspect of the present disclosure, there is provided a vapor deposition apparatus. The vapor deposition apparatus includes an exciting acoustic-wave generator. The exciting acoustic-wave generator is configured to apply an exciting acoustic wave to a target, such that particles in a predetermined location of the target break away from the target and adhere to a predetermined region of the substrate when an energy of the particles is higher than an energy required for the particles to break away from the target.

In an exemplary arrangement of the present disclosure, the exciting acoustic wave is a rectangular standing wave.

In an exemplary arrangement of the present disclosure, the rectangular standing wave is synthesized by a plurality of sine waves or a plurality of cosine waves.

In an exemplary arrangement of the present disclosure, the synthesis of the rectangular standing wave includes partitioning the target into a plurality of periodic units according to a vapor deposition requirement of the substrate. A function of the rectangular standing wave being expressed as:

$$f(x) = \frac{a_0}{2} + \sum_{1}^{\infty} a_n \cos\left(\frac{n\pi x}{L}\right).$$

$a_0$ represents an amplitude of the rectangular standing wave, $a_n$ represents an amplitude of the sine wave or an amplitude of the cosine wave, n represents the number of the sine waves or the number of the cosine waves, and L represents a width of the periodic unit.

In an exemplary arrangement of the present disclosure, a wavelength value of the sine wave and a wavelength value of the cosine wave are within a wavelength value range of an ultrasonic wave.

In an exemplary arrangement of the present disclosure, the vapor deposition apparatus further includes:

a heater, configured to heat the target before applying the exciting acoustic wave to the target, such that an energy of the target is lower than the energy required for the particles to break away from the target.

It is to be understood that the above general description and the detailed description below are merely exemplary and explanatory, and do not limit the present disclosure.

BRIEF DESCRIPTION OF THE DRAWINGS

The accompanying drawings are incorporated in and constitute a part of this specification, illustrate arrangements conforming to the disclosure and together with the description serve to explain the principles of the disclosure. Apparently, the accompanying drawings in the following description show merely some arrangements of the present disclosure, and persons of ordinary skill in the art may still derive other drawings from these accompanying drawings without creative efforts.

DETAILED DESCRIPTION

Figure 1:
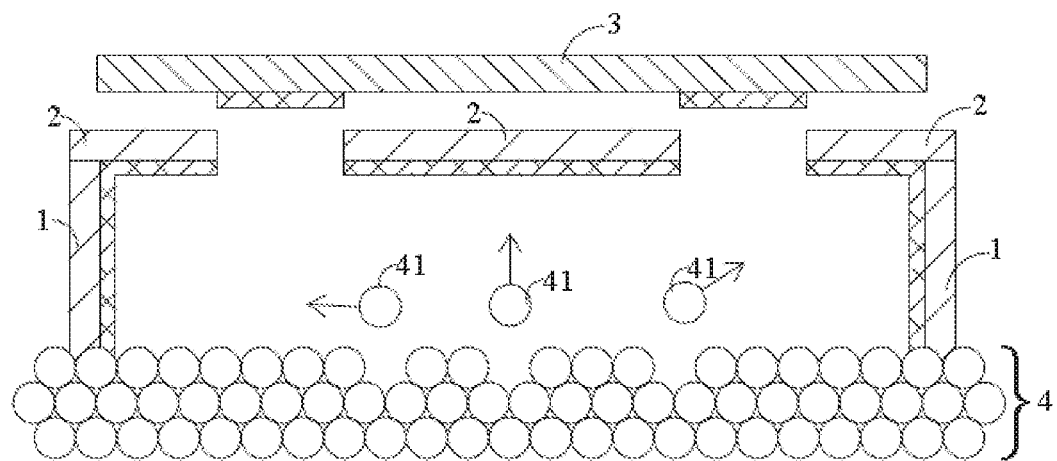
FIG. 1 schematically illustrates a schematic diagram of vapor deposition in the related art.

Exemplary arrangements will now be described more comprehensively by referring to accompanying drawings. However, the exemplary arrangements can be embodied in many forms and should not be construed as limited to the arrangements set forth herein; rather, these arrangements are provided so that this disclosure will be made thorough and complete, and the concept of exemplary arrangements will be fully conveyed to those skilled in the art. Furthermore, the described features, structures, or characteristics may be combined in any suitable manner in one or more arrangements. In the following description, numerous specific details are provided to provide a thorough understanding of the arrangements of the present disclosure. Those skilled in the art will recognize, however, that the technical solution of the present disclosure may be practiced without one or more of the specific details described, or that other methods, components, materials, etc. may be employed. In other instances, well-known technical solutions are not shown or described in detail to avoid obscuring aspects of the present disclosure.

In addition, the accompanying drawings are merely exemplary illustration of the present disclosure, and are not necessarily drawn to scale. The same reference numerals in the drawings denote the same or similar parts, and thus repeated description thereof will be omitted. Some block diagrams shown in the figures are functional entities and not necessarily to be corresponding to a physically or logically individual entities. These functional entities may be implemented in software form, or implemented in one or more hardware modules or integrated circuits, or implemented in different networks and/or processor apparatuses and/or microcontroller apparatuses.

Figure 2:
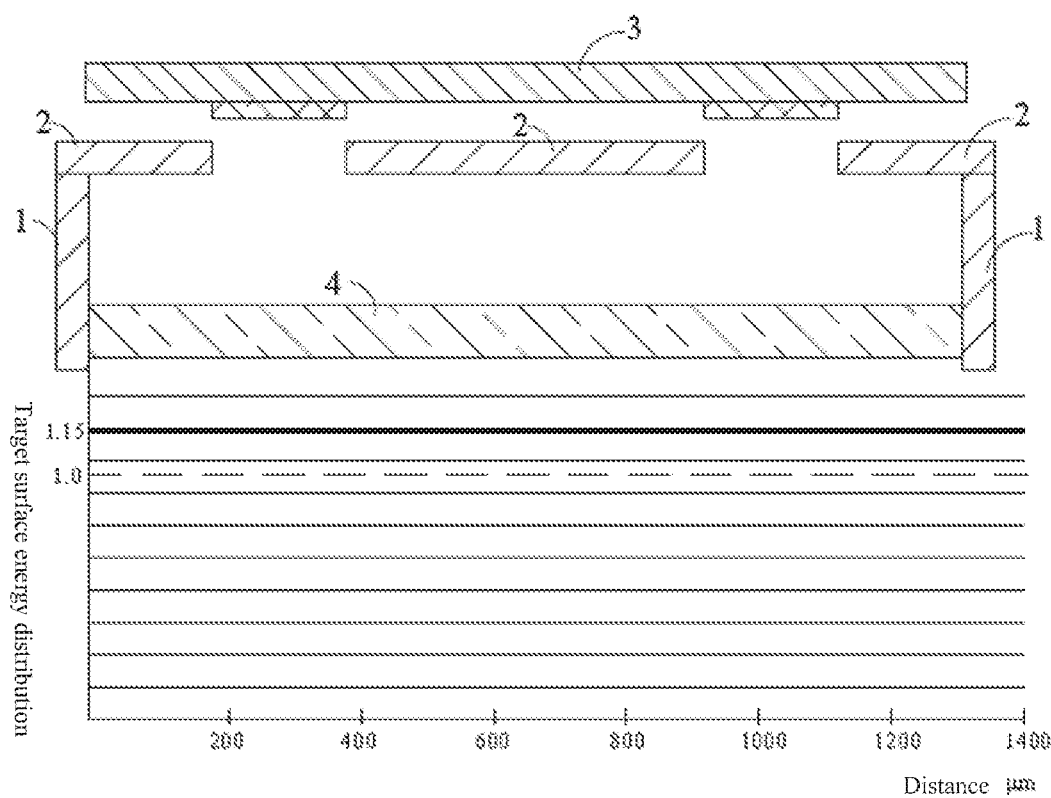
FIG. 2 schematically illustrates a structure diagram and an energy distribution diagram of a vapor deposition apparatus in the related art.

Referring to FIG. 1 and FIG. 2, a schematic diagram of vapor deposition in the related art is illustrated, and a structure diagram and an energy distribution diagram of a vapor deposition apparatus in the related art are illustrated. The dashed line in the figure represents an energy value required for particles 41 to break away from a target 4, and the black heavy line represents an energy value to which the target 4 needs to be heated. To ensure uniformity of vapor deposition, the organic material target 4 may be heated for much time. The organic material particles 41 are heated to break away from the target. The organic material particles 41 are randomly emitted from the surface of the target, and these organic material particles 41 adhere to an inside wall of a crucible 1 and a mask 2 where temperature is lower to exchange energy until energy required for becoming free ions again is lost, such that no scattering occurs. According to statistics, only about 10% of the organic material particles can reach the location required for vapor deposition of a substrate 3. That is, about 90% of the organic material is lost, such that the utilization of the organic material is lower, resulting in higher costs of the organic material. Furthermore, the inside wall of the crucible and the mask also need to be cleaned periodically. Neither the crucible nor the mask can be used during the cleaning process, which not only has a negative effect on the production efficiency, but also wastes manpower and material resources, and also causes environmental pollution. Moreover, corresponding masks need to be produced and provided for each product.

This exemplary arrangement first provides a vapor deposition method.

The vapor deposition method may include the following blocks: providing a target 4; providing a substrate 3, which is configured to receive particles from the target; and block S20: applying an exciting acoustic wave to the target 4, such that particles 41 in a predetermined location of the target 4 break away from the target 4 and adhere to a predetermined region of the substrate 3 when an energy of the particles 41 is higher than an energy required for the particles 41 to break away from the target 4.

According to the vapor deposition method in this exemplary arrangement, in one aspect, by applying the energy to the target 4 using the exciting acoustic wave, the particles 41 in the predetermined location of the target 4 break away from the target 4 and adhere to the predetermined region of the substrate 3, such that there is no requirement to use the crucible 1 and the mask 2, thus the particles 41 on the target 4 does not adhere to the inside wall of the crucible 1 and the mask 2. In this way, loss of a vapor deposition material is avoided, the utilization of the vapor deposition material is increased, and thus the costs are reduced. In another aspect, by adopting the vapor deposition method, there is no requirement to use the mask 2, such that it is not required to produce or provide the corresponding mask 2 for each product, and thus corresponding costs of the mask 2 are saved. In still another aspect, neither the crucible 1 nor the mask 2 needs to be cleaned periodically, and thus the production efficiency is enhanced.

The vapor deposition method in this exemplary arrangement will be further described below.

Figure 3:
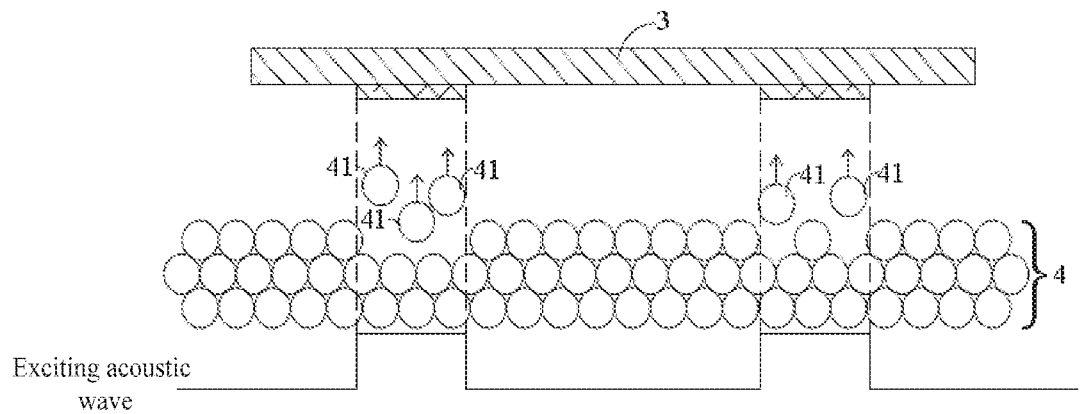
FIG. 3 schematically illustrates a schematic diagram of vapor deposition according to the present disclosure.

Referring to FIG. 3, a schematic diagram of vapor deposition according to the present disclosure is illustrated.

In this exemplary arrangement, when the substrate 3 is vapor-deposited, the target 4 may be placed beneath the substrate 3, and the distance between the target 4 and the substrate 3 is relatively small, on the order of micrometers. Therefore, the scattering phenomenon caused by microscopic thermal motion of the particles 41 may be negligible. Electric energy is converted into ultrasonic wave by an ultrasonic transducer 5, and the ultrasonic wave is reflected by a reflector 6 to from a reflected ultrasonic wave. An exciting acoustic wave formed by the ultrasonic wave and the reflected ultrasonic wave is applied to the target 4. The particles 41 receive energy and break away from the surface of the target 4 and contact the substrate 3. Since the surface temperature of the substrate 3 is lower than the energy value required for the particles 41 to break away from the surface of the substrate 3, the particles 41 adhere to the surface of the substrate 3. Since the energy supplied by the exciting acoustic wave to the particles 41 is directional, a moving direction of the particles 41 after receiving the energy is also directional, i.e., the moving direction of the particles 41 is consisted with the direction of the energy. The predetermined region of the substrate 3 is a region on the substrate 3 where the organic material needs to be vapor-deposited. The predetermined location of the target 4 is a location where the particles 41 in this location is required to be vapor-deposited on the predetermined region of the substrate 3. Therefore, the predetermined location of the target 4 may be a region opposite to, from up to down, the predetermined region of the substrate 3. That is, the projection, of the predetermined location of the target 4, on the substrate 3 overlaps with the predetermined region of the substrate 3. In addition, the particles 41 may be moved onto the substrate by an external force such as gravity or a magnetic field.

Figure 4:
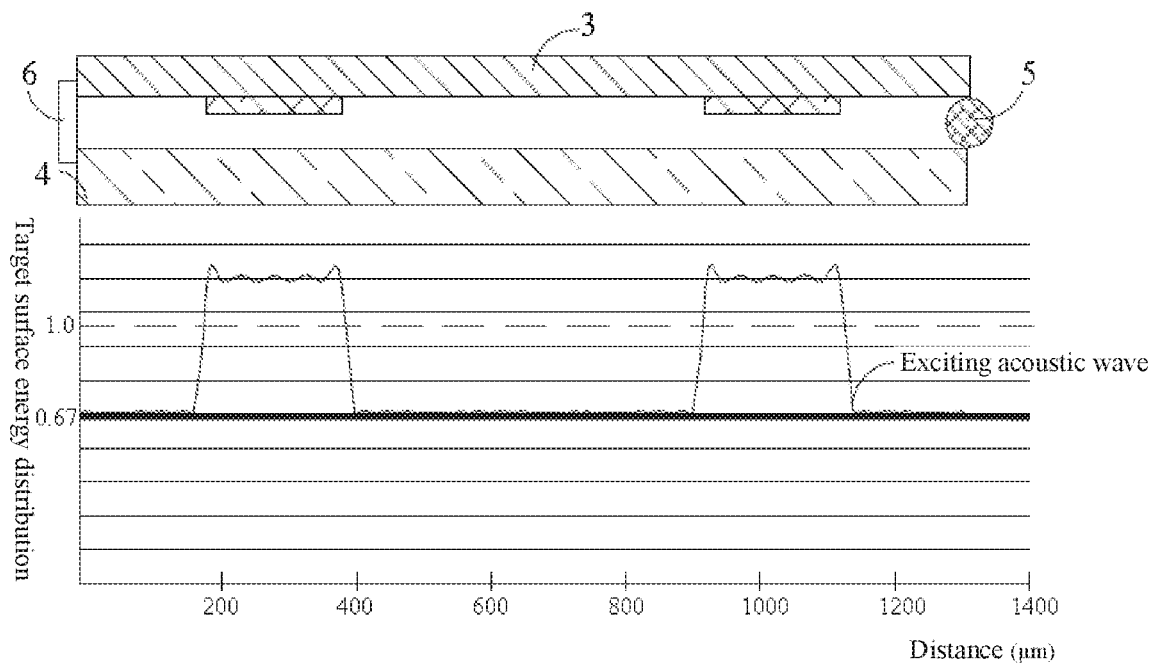
FIG. 4 schematically illustrates a structure diagram and an energy distribution diagram of a vapor deposition apparatus according to the present disclosure.

Referring to FIG. 4, a structure diagram and an energy distribution diagram of a vapor deposition apparatus are illustrated. The dashed line in the figure represents an energy value required for the particles 41 to break away from the target 4, and the black heavy line represents an energy value to which the target 4 needs to be heated.

The exciting acoustic wave may be a rectangular standing wave. In this exemplary arrangement, the rectangular standing wave is not strictly rectangular. If a rectangular coordinate system is established for the rectangular standing wave, a horizontal axis of the coordinate system represents a distance, and a vertical axis of the coordinate system represents an amplitude. Both a rising edge and a falling edge of the rectangular standing wave may be in a state substantially perpendicular to an abscissa, whereas a wave crest of the rectangular standing wave may be in a straight line state or may be in a state with an undulating waveform. The higher the perpendicularity, of the rising edge and the falling edge of the rectangular standing wave, to the abscissa is, the higher the edge accuracy of a pattern formed by vapor deposition is.

The standing wave is a composite wave synthesized by two sine waves having the same amplitude, the same wavelength and the same period based on interference while moving in opposite direction. The waveform of the standing wave cannot move forward, and thus the standing wave cannot transmit energy. When the standing wave passes, each mass point makes a simple harmonic motion. The oscillation amplitude of each mass point is not equal. A point whose amplitude is zero is referred to as a node or a wave node, and a point whose amplitude is the largest is between two nodes, and is referred to as an antinode or a wave antinode. The node is stationary, and thus the waveform of the node is not propagated. Energy is exchanged and stored in the form of kinetic energy and potential energy, and thus the energy cannot be propagated. The energy is applied to the particles 41 by the rectangular standing wave. The energy has a strong directivity, and thus only the particles 41 at the wave crest of the rectangular standing wave is emitted from the surface, and the moving direction of the particles 41 after receiving the energy also has a strong directivity. As can be seen from FIG. 3, the moving direction of the particles 41 is perpendicular to the above-mentioned abscissa. That is, compared with the uncertainty of the moving direction of the particles 41 in the related art, the moving direction of the particles 41 in the present disclosure is controllable. Of course, in other exemplary arrangements of the present disclosure, the exciting acoustic wave may be a rectangular wave instead of a standing wave, and the rectangular wave may be a rectangular ultrasonic wave.

In this exemplary arrangement, the energy is applied to the target 4 by the rectangular standing wave, such that the energy of the particles 41 in the predetermined location of the target 4 is higher than the energy required for the particles 41 to break away from the target 4. After obtaining the energy, the particles 41 break away from the target 4 and then adhere to the predetermined region of the substrate 3. Therefore, a wave crest region of the rectangular standing wave needs to correspond to the predetermined location of the target 4 and the predetermined region of the substrate 3. That is, no matter it is viewed from above or from below the substrate 3, the wave crest region of the rectangular standing wave overlaps with the predetermined location of the target 4 and the predetermined region of the substrate 3. Moreover, the projection, of the wave crest region of the rectangular standing wave, on the substrate 3 overlaps with the predetermined location of the target 4 and the predetermined region of the substrate 3.

In this exemplary arrangement, the rectangular standing wave may be synthesized by a plurality of sine waves or a plurality of cosine waves. Specifically, the synthesis of the rectangular standing wave may include: partitioning the target 4 into a plurality of periodic units according to a vapor deposition requirement of the substrate 3, i.e., a function f(x) may represent a vapor deposition pattern of the substrate 3, and the function of the rectangular standing wave may be expressed as:

$$f(x) = \begin{cases} a_0, & mL < x \le mL + L_1 \\ 0, & mL + L_1 < x \le mL + L_2 \\ a_0, & mL + L_2 < x \le mL + L. \end{cases}$$

In the formula, m represents the number of cycles, a0 represents an amplitude of the rectangular standing wave, L represents a width of the periodic unit, L1 represents a width of a side of the periodic unit required for vapor deposition, L2 represents the sum of the width of the side of the periodic unit required for vapor deposition and a width of a central section of the periodic unit not required for vapor deposition, and based on the Fourier transform, the function is expressed as:

$$f(x) = \frac{a_0}{2} + \sum_{1}^{\infty} a_n \cos\left(\frac{n\pi x}{L}\right),$$

$$a_n = \int_{-L/2}^{L/2} f(x) \cos\left(\frac{n\pi x}{L}\right).$$

The function subject to the Fourier transform may be decomposed into signals of a plurality of cosine waves that may be generated by the ultrasonic transducer 5. The signal of the $n^{th}$ cosine wave is as below:

$$\varphi_n = a_n \cos\left(\frac{n\pi x}{L}\right),$$

wherein n represents the number of the cosine waves, and $a_n$ represents the amplitude of the $n^{th}$ cosine wave.

For example, taking the RA-005EA material of DOW Chemical as an example, the temperature for thermal vapor deposition is 450° C., and the temperature of the glass substrate 3 is 23° C. In this exemplary arrangement, first, the target 4 is heated to 400° C., and then the residual energy intensity is provided through the rectangular standing wave. The width L of the periodic unit of an OLED is equal to 270 μm, the width of the periodic unit may be a pixel pitch of the OLED, the width $L_1$ of a side of the periodic unit required for vapor deposition is equal to 45, the sum $L_2$ of the width of the side of the periodic unit required for vapor deposition and a width of a central section of the periodic unit not required for vapor deposition is equal to 225, the amplitude $a_0$ of the rectangular standing wave is equal to 1, the number of cycles m is equal to 1, and a following function may be obtained:

$$f(x) = \begin{cases} 1, & 270 < x \le 270 + 45 \\ 0, & 270 + 45 < x \le 270 + 225 \\ 1, & 270 + 225 < x \le 270 + 270 \end{cases}.$$

Based on the Fourier transform, the function is expressed as:

$$f(x) = \frac{1}{2} + \sum_{1}^{\infty} a_n \cos\left(\frac{n\pi x}{270}\right)$$

$$a_n = \int_{-270/2}^{270/2} f(x) \cos\left(\frac{n\pi x}{270}\right).$$

The signal of the $n^{th}$ cosine wave is expressed as:

$$\phi_n = a_n \cos\left(\frac{n\pi x}{270}\right).$$

The larger the number of ultrasonic waves is, the more the standing wave formed is similar to the rectangular standing wave, i.e., the larger the n is, the better it is. However, considering the actual production precision demand, by calculation, it may be obtained that the edge half-wave width of the rectangular standing wave is about 10 μm when n=19, which is superior to the accuracy requirement (30 μm) of the existing mask. When the n is further increased, the half-wave width may be close to zero.

In this exemplary arrangement, a wavelength value of the sine wave and a wavelength value of the cosine wave may be within a wavelength value range of the ultrasonic wave. As a sound wave having a frequency higher than 20,000 Hz, the ultrasonic wave is good in directivity, strong in penetrability, and easy to obtain more concentrated sound energy.

Theoretical studies show that under the same amplitude, the vibrational energy of an object is in direct proportion to the vibration frequency. When the ultrasonic wave is propagated in a medium, the vibration frequency of a medium mass point is high, and thus the energy is large. The mechanical action of the ultrasonic wave may contribute to the emulsification of a liquid, the liquefaction of a gel and the dispersion of a solid.

Figure 5:
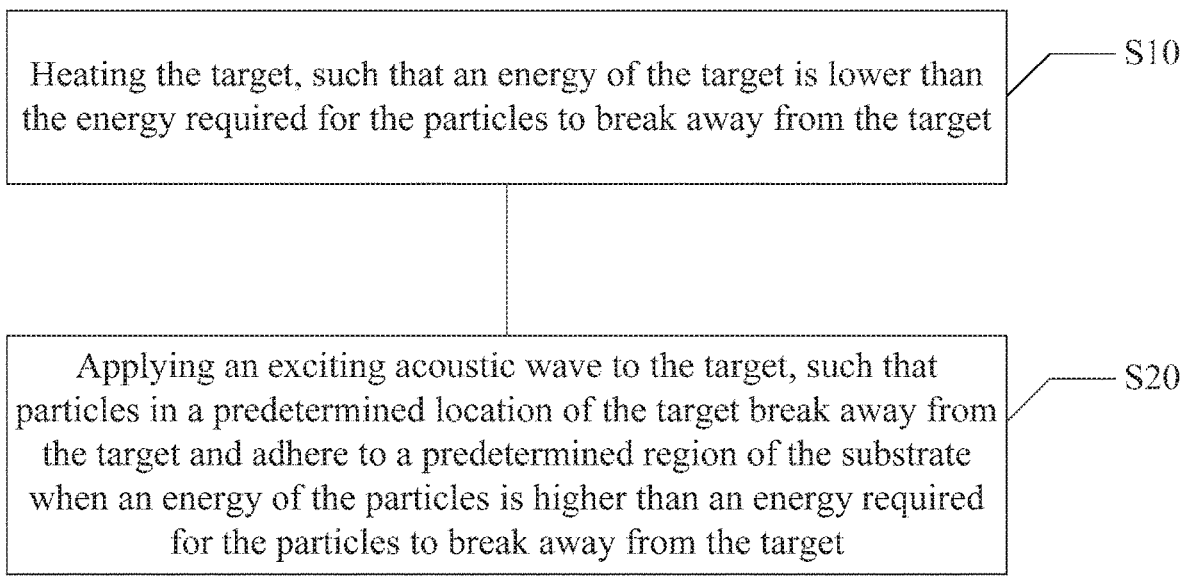
FIG. 5 schematically illustrates a flowchart of a vapor deposition method according to an exemplary arrangement of the present disclosure.

Referring to FIG. 5, a flowchart of a vapor deposition method according to an exemplary arrangement is illustrated. Before applying the exciting acoustic wave to the target 4, the vapor deposition method may further include block S10: heating the target 4, such that an energy of the target 4 is lower than the energy required for the particles 41 to break away from the target 4.

Heating the target 4 specifically refers to heating the target 4 before applying the exciting acoustic wave to the target 4, such that the energy of the target 4 is lower than the energy required for the particles 41 to break away from the target 4. The heating process is relatively easy to implement with respect to the process of applying the exciting acoustic wave, and by heating it is faster to increase the energy of the target 4. By the process of heating and then applying the exciting acoustic wave, the intensity of the energy applying the exciting acoustic wave may be reduced, the exciting acoustic wave may be formed relatively easily, and the vapor deposition efficiency may be greatly improved. Of course, those skilled in the art may understand that the exciting acoustic wave may be directly applied to the target 4 without heating.

In this exemplary arrangement, the target 4 is heated such that the energy value of the target 4 reaches about ⅔ of an evaporation energy (the evaporation energy is an energy required for vapor deposition to which the target is heated separately, and the temperature is about 400° C.-500° C., based on different vapor deposition materials). The target 4 may be heated up to 0.7 or 0.8 or the like of the evaporation energy, as long as it is lower than the evaporation energy, and the energy value of the target 4 is not particularly limited herein.

Further, this exemplary arrangement also provides a vapor deposition apparatus corresponding to the above vapor deposition method. The vapor deposition apparatus may include an exciting acoustic-wave generator and a heater, etc.

The exciting acoustic-wave generator may be configured to apply an exciting acoustic wave to the target 4, such that particles 41 in a predetermined location of the target 4 break away from the target 4 and adhere to a predetermined region of the substrate 3 when an energy of the particles 41 is higher than an energy required for the particles 41 to break away from the target 4.

In this exemplary arrangement, the exciting acoustic-wave generator includes an ultrasonic transducer 5 and a reflector 6. The ultrasonic transducer 5 and the reflector 6 may be oppositely arranged at two ends of a sputtering chamber. The ultrasonic transducer 5 converts an electric energy into an ultrasonic wave, which is reflected by the reflector 6 to form a reflected ultrasonic wave. The ultrasonic wave and the reflected ultrasonic wave form the exciting acoustic wave. The ultrasonic transducer 5 may be provided with the ultrasonic wave outputting a plurality of modes. The ultrasonic wave is reflected by the reflector 6 to finally form a rectangular standing wave whose fixed position is a wave crest.

The ultrasonic transducer 5 is a cylindrical ultrasonic transducer, and the reflector 6 is made of stainless steel. A horn-shaped ultrasonic transducer, an aluminum-plate-shaped ultrasonic transducer or the like may also be used. The reflector 6 also may be made of other metal or non-metal materials.

In this exemplary arrangement, the exciting acoustic wave is a rectangular standing wave.

In this exemplary arrangement, the rectangular standing wave is synthesized by a plurality of sine waves or a plurality of cosine waves.

In this exemplary arrangement, the synthesis of the rectangular standing wave may include partitioning the target 4 into a plurality of periodic units according to a vapor deposition requirement of the substrate 3. A function of the rectangular standing wave being expressed as:

$$f(x) = \frac{a_0}{2} + \sum_{1}^{\infty} a_n \cos\left(\frac{n\pi x}{L}\right).$$

$a_0$ represents an amplitude of the rectangular standing wave, $a_n$ represents an amplitude of the sine wave or an amplitude of the cosine wave, n represents the number of the sine waves or the number of the cosine waves, and L represents a width of the periodic unit.

In this exemplary arrangement, a wavelength value of the sine wave and a wavelength value of the cosine wave are within a wavelength value range of an ultrasonic wave, i.e., the exciting acoustic-wave generator may be an ultrasonic generator.

Still further, in this exemplary arrangement, the exciting acoustic-wave generator may be an ultrasonic standing wave generator.

In this exemplary arrangement, the vapor deposition apparatus may further include a heater, which may be configured to heat the target 4 before applying the exciting acoustic wave to the target 4, such that an energy of the target 4 is lower than the energy required for the particles 41 to break away from the target 4. The heater may be a heater used in the existing vapor deposition process. Thus, existing devices may be used without manufacturing new devices, therefore maximizing the utilization of the existing resources.

The specific details of each module in the above vapor deposition apparatus have been described in detail in the corresponding vapor deposition method, and therefore will not be described herein.

Other arrangements of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and arrangements be considered as exemplary only, with a true scope and spirit of the present disclosure being indicated by the appended claims.

What is claimed is:

1. A vapor deposition method comprising:
providing a target;
providing a substrate, the substrate configured to receive particles from the target; and
applying an exciting acoustic wave to the target, such that the particles in a predetermined location of the target break away from the target and adhere to a predetermined region of the substrate when an energy of the particles is higher than an energy required for the particles to break away from the target,
wherein the exciting acoustic wave is a rectangular standing wave, and the rectangular standing wave is synthesized using a plurality of sine waves or a plurality of cosine waves,
wherein synthesizing the rectangular standing wave comprises:
partitioning the target into a plurality of periodic units according to a vapor deposition requirement of the substrate, a function of the rectangular standing wave being expressed as:

$$f(x) = \frac{a_0}{2} + \sum_{1}^{\infty} a_n \cos\left(\frac{n\pi x}{L}\right),$$

wherein $a_0$ represents an amplitude of the rectangular standing wave, $a_n$ represents an amplitude of the sine wave or an amplitude of the cosine wave, n represents a number of the sine waves or a number of the cosine waves, and L represents a width of the periodic unit.

2. The vapor deposition method according to claim 1, wherein a wavelength value of the sine wave and a wavelength value of the cosine wave are within a wavelength value range of an ultrasonic wave.

3. The vapor deposition method according to claim 1, wherein before applying an exciting acoustic wave to the target, the vapor deposition method further comprises:
heating the target, such that an energy of the target is lower than the energy required for the particles to break away from the target.

4. The vapor deposition method according to claim 3, wherein a temperature for heating the target ranges from 400° C. to 500° C.

* * * * *